United States Patent [19]

Cox

[11] Patent Number: 4,694,275
[45] Date of Patent: Sep. 15, 1987

[54] DIGITAL CAPACITANCE INCREMENTAL ENCODER

[75] Inventor: Karmen D. Cox, St. Charles County, Mo.

[73] Assignee: Emerson Electric Co., St. Louis, Mo.

[21] Appl. No.: 858,345

[22] Filed: May 1, 1986

[51] Int. Cl.⁴ .............................................. H03M 1/22
[52] U.S. Cl. ............................ 340/347 P; 340/347 M; 340/870.37
[58] Field of Search ........ 340/347 P, 347 M, 347 CC; 250/231 SE

[56] References Cited

U.S. PATENT DOCUMENTS 2,656,106 10/1953 Stabler ............................. 340/347 P Primary Examiner—T. J. Sloyan
Attorney, Agent, or Firm—Polster, Polster and Lucchesi

[57] ABSTRACT

A system for encoding position information includes a grid of evenly spaced, parallel conductive lines fixed with respect to one of two mechanical parts, the grid being disposed along the line of movement of the parts. Two pairs of interdigitated electrodes capacitively sense the conductive lines of the grid, the electrodes being fixedly disposed on the other mechanical part. Decoding circuitry is responsive to the electrodes for providing relative movement information. The fingers of each electrode are disposed substantially parallel to the grid lines, the capacitance of each electrode with respect to the grid being a function of the proximity of the fingers of that electrode to the grid lines. The decoding circuitry includes first and second latches whose outputs are a function of which electrode of its corresponding pair has the greater capacitance to the grid. The second pair of interdigitated electrodes is offset from the first pair such that its ouput differs from that of the first pair. The decoding circuitry further includes circuitry responsive to the output of the latches for determining the direction of travel of the mechanical parts with respect to each other.

9 Claims, 10 Drawing Figures

DIGITAL CAPACITANCE INCREMENTAL ENCODER

BACKGROUND OF THE INVENTION

This invention relates generally to position sensing, and more particularly to capacitively sensing the position of one mechanical part with respect to another.

There are many occasions when it is necessary to know the position of one mechanical part relative to another. For example, in a radial arm saw it is necessary to know the elevation of the saw blade with respect to a work table. Another example would be the relative position of the jaws of a pair of calipers. In fact, in the latter case, providing the relative position of the two mechanical parts is the entire function of the device. Many other examples could be given. Heretofore, such measurement has often been done mechanically. Mechanical measurement is subject to several errors, however, not the least of which are human operator error and mechanical wear of the measuring components. Electronic measuring devices in some respects eliminate these errors, but heretofore electronic measuring devices were not suitable for all measuring applications. Some electronic measuring devices could be too expensive, for example, for use in some consumer items, and/or they might suffer adversely from a harsh environment in which the measurement would be taken. An example is the measurement of various saw positions (elevation, bevel angle, mitre angle, etc.) in connection with powered saws such as table saws and radial arm saws. Particularly when these saws are to be used by the ordinary consumer, the cost of adequate electronic measuring devices can be prohibitive as well. It should also be appreciated that heretofore electronic position measuring devices have taken up considerable space and have involved a number of mechanical parts, neither of which is desirable in a consumer item.

SUMMARY OF THE INVENTION

Among the various objects and features of the present invention may be noted the provision of a position encoding system and encoder which are reliable and accurate.

Another object of the present invention is the provision of such a system and encoder which are relatively low in cost.

A third object of the present invention is the provision of such a system and encoder which operate well in relatively harsh environments.

A fourth object of the present invention is the provision of such a system and encoder which are relatively small in size.

A fifth object of the present invention is the provision of such a system and encoder which have a relatively low number of mechanical parts.

Other objects and features will be in part apparent and in part pointed out hereinafter.

Briefly, a system for encoding relative position information of the present invention includes first and second mechanical parts movable with respect to each other, whose relative position is to be determined. A grid of evenly spaced, parallel conductive lines is fixed with respect to one of the mechanical parts, the grid being disposed along the line of movement of one mechanical part with respect to the other. A sensor for capacitively sensing the conductive lines of the grid is fixedly disposed on the other mechanical part along the line of movement. And a decoder is responsive to the sensor for decoding the output of the sensor into relative movement information.

A digital capacitance encoder of the present invention for encoding position information of first and second mechanical parts movable with respect to each other includes a grid of evenly spaced, parallel conductive lines fixed with respect to one of the mechanical parts, the grid being disposed along the line of movement of one mechanical part with respect to the other. A sensor for capacitively sensing the conductive lines of the grid is fixedly disposed on the other mechanical part along the line of movement. Structure is provided for forcing the sensor into close proximity with the grid as the mechanical parts are moved with respect to each other, the forcing structure being stationary with respect to the sensor.

BRIEF DESCRIPTION OF THE DRAWINGS

Similar reference characters indicate similar parts throughout the several views of the drawings.

DESCRIPTION OF THE PREFERRED EMBODIMENT

Figure 1:
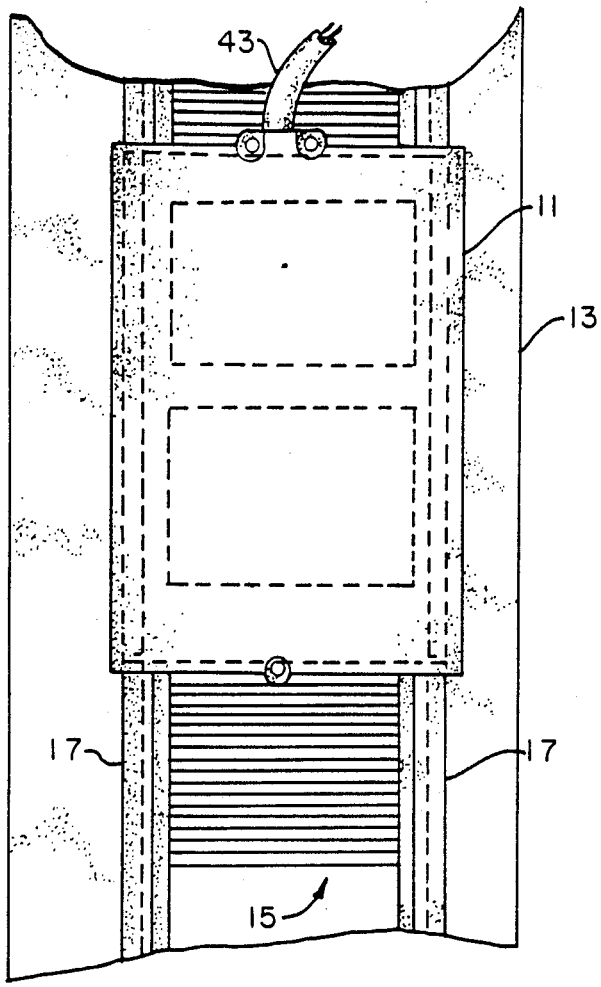
FIG. 1 is a front elevation of a digital capacitance encoder system of the present invention.
Figure 5:
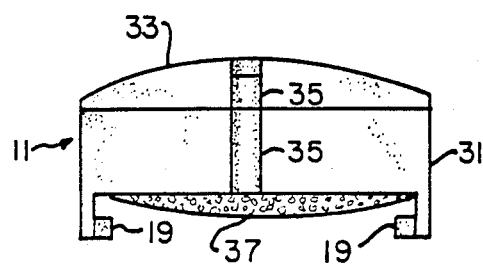
FIG. 5 is a front elevation of an encoder used in conjunction with the grid of FIG. 2.

The digital capacitance position encoding system of the present invention is illustrated in use (FIG. 1) in detecting the relative position of a first mechanical part 11 (shown as a housing) with respect to a second mechanical part 13 (shown as an upstanding post). Such mechanical parts might appear in a radial arm saw for example, in which case the relative movement of the housing 11 with respect to the post 13 would correspond to movement of the saw blade with respect to a work table. Post 13 has fixedly secured thereto a grid 15 of evenly spaced, parallel conductive lines. Grid 15 is electrically connected to ground or some suitable reference potential and all its conductive lines are essentially at that potential. The grid is laid out with its longitudinal axis disposed along the line of travel of housing 11 with respect to the post. Post 13 includes a pair of rails 17, each of which has an outwardly extending lip. Rails 17 are parallel to grid 15 and define the line of movement of the housing with respect to the post. Housing 11 is slidingly mounted on rails 17 and, depending upon the application, could be fixedly mounted to any other mechanical part whose motion with respect to post 13 one wants to measure. Housing 11 includes inwardly extending lips 19 (FIGS. 5 and 6) which engage the lips of rails 17 to hold the housing on the rails.

Figure 2:
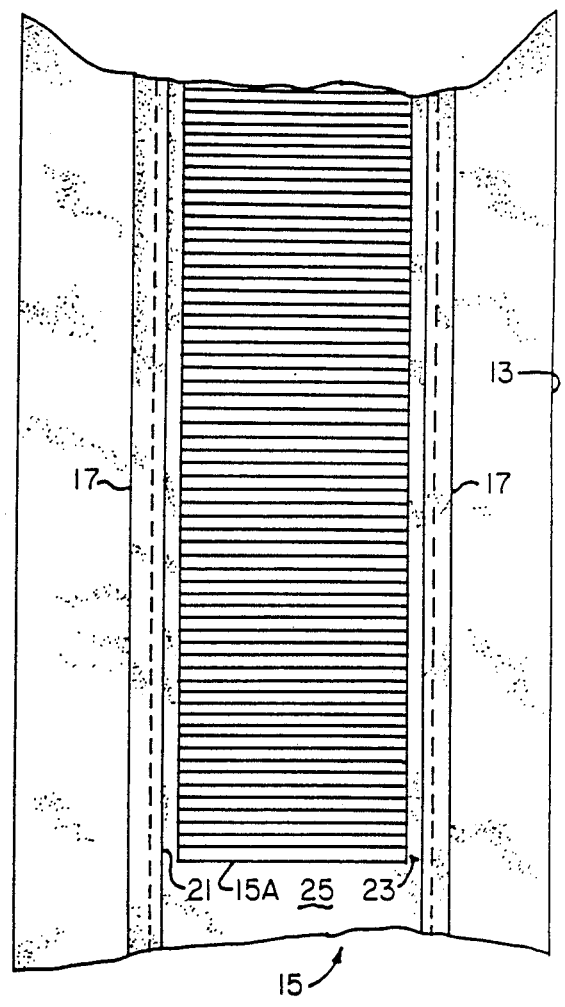
FIG. 2 is a front elevation of a conductive grid of the present invention affixed to a mechanical part.

Grid 15 (FIG. 2) extends upwardly from its starting position (labelled 15A) a distance corresponding to the anticipated length of travel of the housing with respect to the post. All the conductive parallel lines of the grid are electrically connected to two buses 21 and 23 which extend along the sides of the grid from a conductive base section 25. However, the exact structure of the grid, other than the fact that it is composed of parallel, evenly spaced conductive lines all at a reference potential, is of lesser importance. For clarity of illustration, the size of buses 21 and 23 is not drawn to scale.

Figure 3:
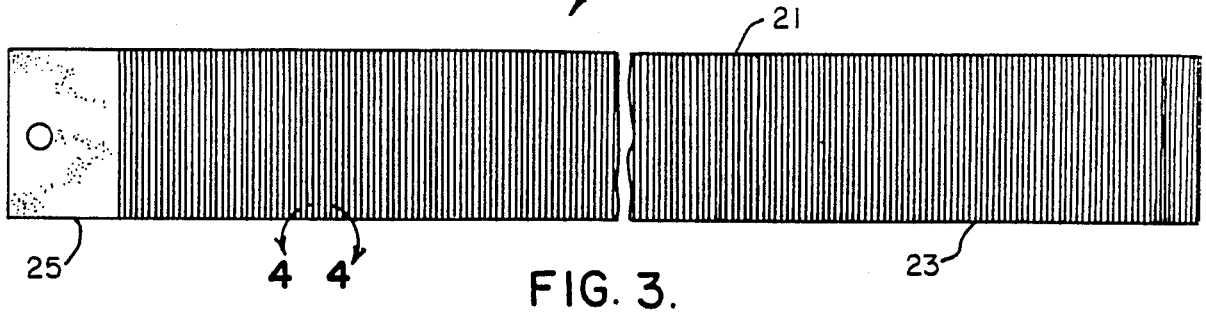
FIG. 3 is a schematic representation of the mask used in preparing the conductive grid of FIG. 2.
Figure 4:
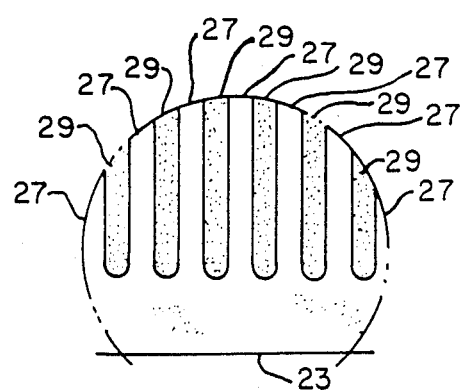
FIG. 4 is a detail of the portion of FIG. 3 labelled A.

The structure of grid 15 is illustrated in more detail in FIGS. 3 and 4. The grid is preferably formed of a conductive material such as copper on a suitable substrate such as a paper based phenolic. This particular grid has parallel conductive lines over a length of eight and one-quarter inches and the grid is a little over one inch wide. The lines (labelled 27 in FIG. 4) and the spaces 29 between the lines are of the same width, namely 0.020 inch. For accurate position measurement it is important that the accumulated error in positioning of the lines not exceed approximately 0.010 inch over the length of the grid.

Figure 6:
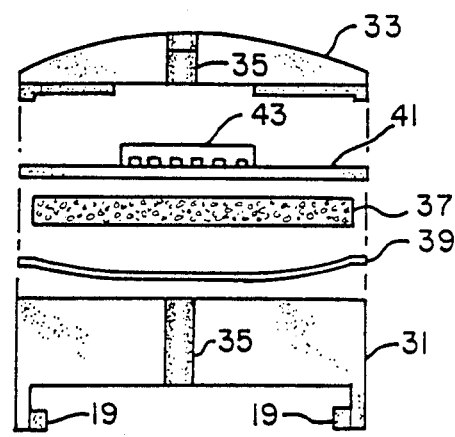
FIG. 6 is an exploded view of the encoder of FIG. 5.

Housing 11 (FIGS. 5 and 6) has a lower housing half 31 from which downwardly and inwardly extend lips 19. In use housing half 31 is secured to an upper housing half 33 by suitable fasteners disposed in a plurality of integrally molded fastener receiving lugs 35. The housing itself is made of a hard plastic such as ABS. During use a resilient foam pad 37 extends downwardly into the space between lower housing half 31 and the inwardly extending lips 19. The resilient foam pad has a dual function. First, it forces a flexible circuit 39 (FIG. 6) into close proximity with grid 15 as the housing is moved along the post. Second, since at its ends it extends slightly beyond the flexible circuit, it brushes directly against grid 15 and thereby provides a cleaning or wiping action. This is important in a dirty environment such as in a radial arm saw. As seen in FIG. 6, housing 11 also contains a rigid printed circuit board 41 carrying electronic components 43 (only one of which is shown for clarity). If the housing is equipped with all the necessary electronics and a display (such as would be the case if the present system were used for a pair of electronic calipers), it is not necessary to provide any output to the outside world. However, in the radial saw embodiment, it is desirable to use a cable 43 (FIG. 1) to supply position information from the housing to the control electronics of the saw (not shown).

Figure 7:
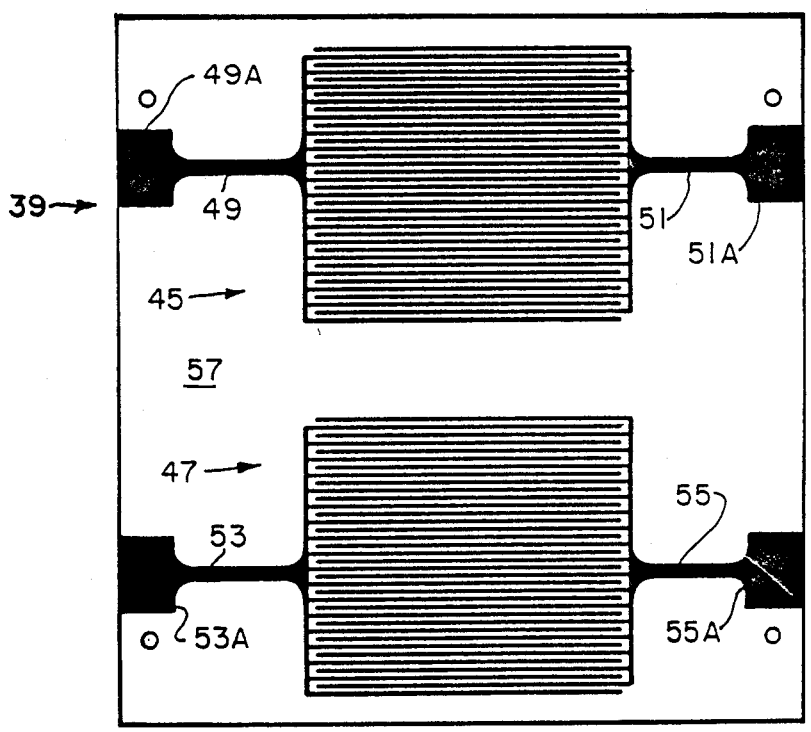
FIG. 7 is a top plan, on an enlarged scale, of sensing electrodes of the present invention.

Flexible circuit 39 (FIG. 7) has first and second pairs 45 and 47 of interdigitated electrodes 49, 51, 53 and 55 printed in copper or silver ink on a flexible substrate 57 made of a material such as that sold by Du Pont under the trade designation Kapton. Each electrode terminates in a corresponding pad 49A, 51A, 53A and 55A for making electrical connection with the circuitry of FIG. 9 or an equivalent circuit. The lines or fingers of each electrode are 0.010 inch wide and the finger spacing for each electrode is 0.040 inch. However, since each pair of electrodes is interdigitated, the nearest finger to any given finger belongs to the other electrode of that pair and the space between them is only 0.010 inch. The fingers of the electrodes are approximately 0.82 inch long and each electrode is approximately 0.75 inch wide as measured along the line of movement of the housing with respect to the post.

The center to center spacing of the fingers of each electrode is the same as that of the conductive lines 27 of grid 15. This means (FIG. 8) that if the fingers 61 of electrode 49 are aligned exactly with grid lines 27, then fingers 63 of electrode 51 will be aligned exactly with the spaces 29 between the grid lines. In this situation, and in any situation in which fingers 61 are closer to the grid lines than the fingers 63, the capacitance between electrode 49 and the grid exceeds the capacitance between electrode 51 and the grid.

Figure 8:
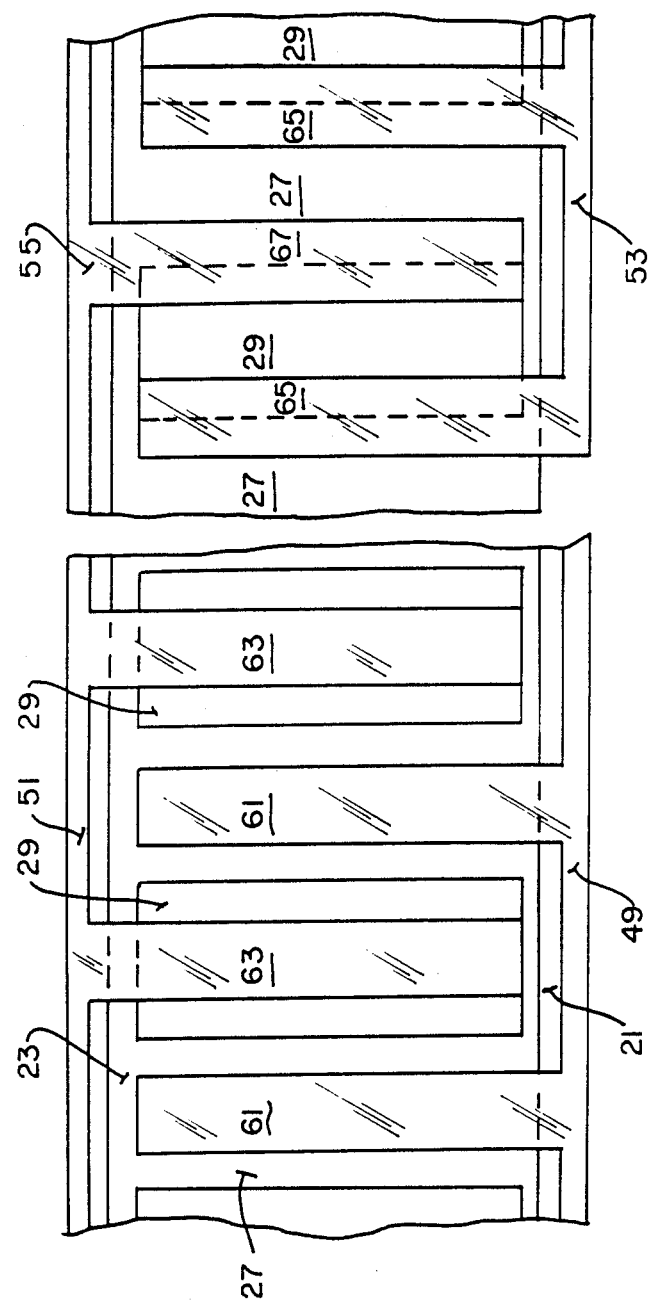
FIG. 8 is a schematic illustrating the use of the sensing electrodes of FIG. 7 with the grid of FIG. 2.

As seen in the right-hand side of FIG. 8, electrodes 53 and 55 are offset with respect to the grid when compared with electrodes 49 and 51. More specifically, when the fingers of electrodes 49 and 51 are aligned with the lines and spaces of the grid as described above, the fingers 65 of electrode 53 and the fingers 67 of electrode 55 overlap the boundary between the lines and spaces of the grid. In effect, this second pair of electrodes is offset ninety degrees with respect to the first pair of electrodes. This offset permits the present system to have an accuracy of 0.010 inch and also permits the system to detect the direction of relative motion of the two mechanical parts 11 and 13.

Figure 9:
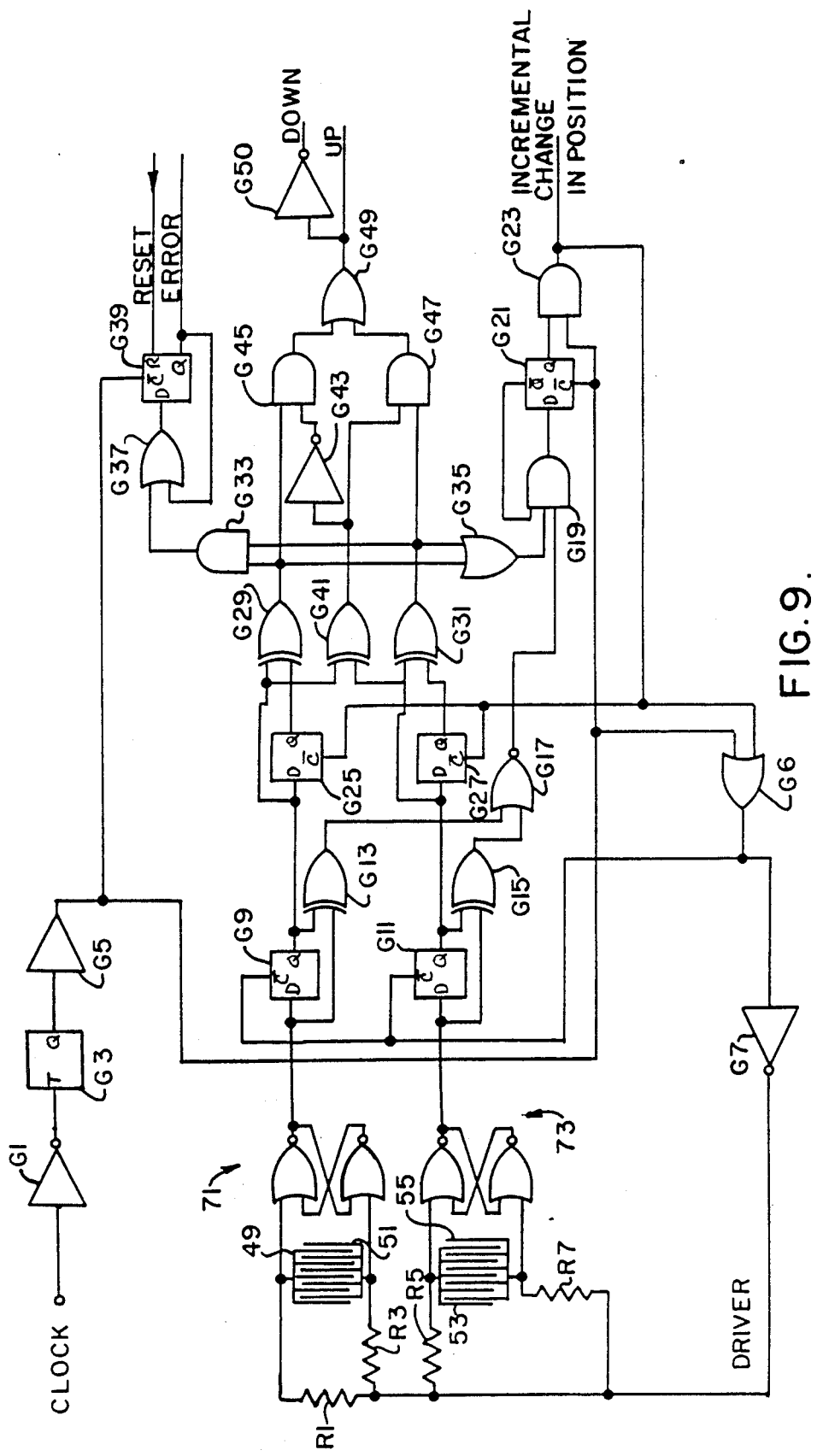
FIG. 9 is an electrical schematic of decoding circuitry of the present invention.

Although a discrete electronic circuit is shown in FIG. 9 for decoding the signals from electrodes 49, 51, 53, and 55, it should be realized that the decoding could also be done by a microprocessor using appropriate software or in other equivalent ways. The decoding circuitry takes an external clock signal having a frequency of, for example, 100 KHz, and supplies it through an inverter G1, a T-type flip-flop G3, a line driver G5, and an OR gate G6 to an inverter G7. The output of inverter G7 is a driver signal which is supplied through four 100 K-ohm, five per cent resistors R1, R3, R5, and R7 to electrodes 49, 51, 53, and 55 respectively. Electrodes 49 and 51 are connected to the set and reset inputs of a latch 71. When the clock signal goes Low, the voltages on these inputs begin to decay simultaneously. The last one to go Low determines the state or output of latch 71. And which input goes Low last is determined by the capacitance of electrodes 49 and 51 with respect to grid 15. Preferably this capacitance is in the range of from five to thirty picofarads. The output of latch 71 thus represents which electrode is closest to the lines of grid 15. Latch 71 is implemented in NOR gates and these gates must have a high input impedance such as occurs when the gates are MOS, CMOS or PMOS. Similarly, electrodes 53 and 55 are connected to the set and reset inputs of a latch 73 whose output represents which of those electrodes is closest to the lines of grid 15.

The outputs of latches 71 and 73 are supplied to a pair of D-type flip-flops G9 and G11 which are clocked by the output of OR gate G6. These flip-flops are used to debounce the signals received from latches 71 and 73. If the outputs of the latches have changed since the previous clock period, this fact is fed through a pair of exclusive-OR gates G13 and G15 connected across flip-flops G9 and G11 respectively to a NOR gate G17. The resulting Low output of NOR gate G17 disables an AND gate G19. This gate's output goes Low and that Low is supplied through a D-type flip-flop G21 to an AND gate G23, thereby disabling the latter gate as well. Gate G23 controls the clocking of a pair of D-type flip-flops G25 and G27 whose inputs are the outputs of flip-flops G9 and G11 and also supplies information of a change in position to the saw control circuitry. Once the input and ouputs of flip-flops G9 and G11 are again the same, indicating that the signals from latches 71 and 73 have stabilized, gate G23 clocks flip-flops G25 and G27 so that the new information appears on the outputs of those flip-flops. That is, the outputs of flip-flops G25 and G27 change only when there has been a debounced change in the sampled output of latches 71 and 73.

The outputs of flip-flops G9 and G25 (both associated with latch 71) are supplied to an exclusive-OR gate G29. Similarly the outputs of flip-flops G11 and G27 (both associated with latch 73) are supplied to an exclusive-OR gate G31. The outputs of both these gates are supplied to an AND gate G33 and an OR gate G35. The output of OR gate G35 is supplied to AND gate G19 and controls through that gate the clocking of flip-flops G25 and G27. If both inputs of AND gate G33 are High, this indicates that both latches 71 and 73 have changed state at the same time. Since the electrodes to which those latches are connected are offset ninety degrees, the latches should never enter this condition. Thus, such a condition indicates an error has occurred. This error signal is fed through an OR gate G37 to a D-type flip-flop G39 whose output is fed back through the OR gate to latch the Q-output of the flip-flop until an external reset signal is received. The error signal is supplied, for example, to the saw control circuitry (not shown).

The outputs of flip-flops G9 and G11 are also supplied to the inputs of an exclusive-OR gate G41. The output of gate G41 is supplied through an inverter G43 to an AND gate G45 and directly to an AND gate G47. The other input to gate G45 is the output of exclusive-OR gate G29 (associated with latch 71), while the other input to gate G47 is the output of exclusive-OR gate G31 (associated with latch 73). The outputs of gates G45 and G47 are supplied to an OR gate G49. Whenever either output goes High, the output of gate G49 goes High. A High output of this gate represents the fact that the housing 11 is moving upwardly with respect to post 13. That output, along with a complementary output generated by an inverter G50, is supplied to the external saw control circuitry which keeps track of the direction of motion. With this information and with the output of gate G23, which indicates when a change of one increment of 0.010 inch in position has occurred, the external control circuitry keeps accurate track of the relative position of the housing with respect to the post.

Figure 10:
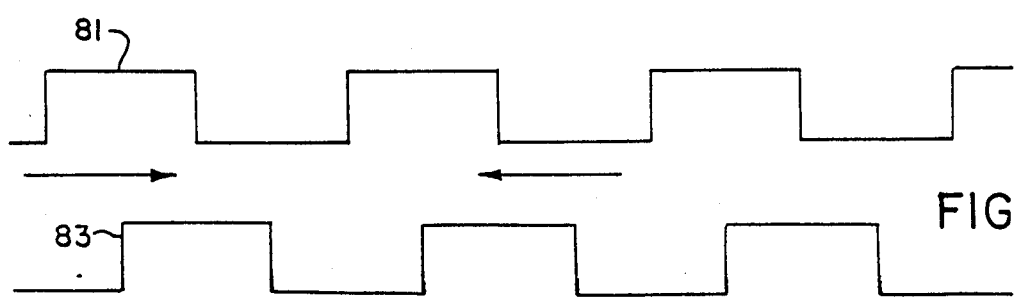
FIG. 10 is a diagram illustrating the detection of direction of motion using the circuitry of FIG. 9.

The operation of the circuitry of FIG. 9 in determining direction of motion is more readily understood by examining the waveforms of FIG. 10. In this Figure the waveform appearing at the output of flip-flop G25 (associated with latch 71) is labelled 81, while the waveform appearing at the output of flip-flop G27 (associated with latch 73) is labelled 83. When motion of the housing with respect to the post is in a first direction, indicated by the arrow pointing to the right, waveform 81 falls while waveform 83 is High and rises while waveform 83 is Low. When the motion is in the opposite direction, however, waveform 81 falls while waveform 83 is Low and rises while waveform 83 is High. By examining the state of one waveform during a transition of the other waveform, therefore, the direction of motion is determined.

Although the present invention has been described with reference to two pairs of interdigitated electrodes, it should be realized that a single pair can function in the same manner, although with slightly reduced resolution and without the capability of determining the direction of the motion. Similarly, additional pairs of electrodes, each pair offset from all previous pairs, could be added to the present system to improve the resolution of the present system even further.

In view of the above, it will be seen that the various objects and features of the present invention are achieved and other advantageous results are attained.

As various changes could be made in the above constructions without departing from the scope of the invention, it is intended that all matter contained in the above description or shown in the accompanying drawings shall be interpreted as illustrative and not in a limiting sense.

What is claimed is:

1. A digital capacitance encoder for encoding position information of first and second mechanical parts movable with respect to each other comprising:

a grid of evenly spaced, parallel conductive lines fixed with respect to one of the mechanical parts, said grid being disposed along the line of movement of one mechanical part with respect to the other;

means for capacitively sensing the conductive lines of the grid, said sensing means including a first pair of interdigitated electrodes fixedly disposed on the other mechanical part along the line of movement with the fingers thereof substantially parallel to the lines of the grid, means for sensing which electrode of the pair has the greatest capacitance to the grid, drive means for applying a square waveform to each electrode, a latch or the like having its set input connected to one of the electrodes and the reset input connected to the other of the electrodes so that the output of the latch is a function of which electrode has the greatest capacitance to the grid, and a second pair of interdigitated electrodes fixedly disposed on the same mechanical part as the first pair along the lines of movement, said second pair being disposed from the first pair such that its output differs from that of the first pair as the mechanical parts move with respect to each other; and means for forcing the sensing means into close proximity with the grid as the mechanical parts are moved with respect to each other, said forcing means being stationary with respect to the sensing means.

2. The encoder as set forth in claim 1 further including means for decoding the output of the sensing means into relative movement information.

3. The encoder as set forth in claim 1 wherein the decoding means includes a second latch or the like whose output is a function of which electrode of the second pair has the greatest capacitance to the grid, said decoding means further including means responsive to the output of the latches for determining the direction of travel of the mechanical parts with respect to each other.

4. The encoder as set forth in claim 1 wherein the spacing of the fingers of each electrode is a multiple or submultiple of the grid line spacing.

5. The encoder as set forth in claim 1 wherein the forcing means in resilient and extends at predetermined locations past the sensing means to touch and clean the grid as the mechanical parts are moved with respect to each other.

6. The encoder as set forth in claim 5 wherein the forcing means is a pad disposed behind the sensing means as seen from the grid and extending past the ends of the sensing means to touch the grid.

7. The encoder as set forth in claim 1 wherein the finger spacing of each electrode is the same as the line spacing of the grid, so that when fingers of one electrode of a pair are aligned with lines of the grid the fingers of the other electrode of that pair are aligned with the spaces between the lines of the grid.

8. The encoder as set forth in claim 1 including a second latch or the like whose output is a function of which electrode of the second pair has the greatest capacitance to the grid, said decoding means further including means responsive to the output of the latches for determining the direction of travel of the mechanical parts with respect to each other.

9. The encoder as set forth in claim 1 further including a resistor disposed between each electrode and the drive means so that the time it takes each excursion of the square waveform to decay is a function of the capacitance of the corresponding electrode to the grid.

* * * * *